United States Patent [19]

Hamamoto

[11] Patent Number: 5,502,679
[45] Date of Patent: Mar. 26, 1996

[54] ELECTRICALLY ERASABLE NONVOLATILE MEMORY HAVING DISCHARGING CIRCUITS

[75] Inventor: Katsuya Hamamoto, Tokyo, Japan

[73] Assignee: Seiko Instruments Inc., Japan

[21] Appl. No.: 232,613

[22] Filed: Apr. 25, 1994

[30] Foreign Application Priority Data

Apr. 28, 1993 [JP] Japan .................................. 5-102944

[51] Int. Cl.$^6$ .................................................. G11C 16/02
[52] U.S. Cl. ............... 365/185.23; 365/185; 365/189.09; 365/226; 365/230.06
[58] Field of Search ..................................... 365/203, 204, 365/185, 189.09, 226, 228, 230.06

[56] References Cited

U.S. PATENT DOCUMENTS

| 4,905,197 | 2/1990 | Urai ......................................... 365/204 |
| 5,138,575 | 8/1992 | Ema et al. ............................... 365/185 |

Primary Examiner—David C. Nelms
Assistant Examiner—Andrew Q. Tran
Attorney, Agent, or Firm—Adams & Wilks

[57] ABSTRACT

When power is turned off during erasure or writing of an EEPROM, electric charge remains on the bit and word selecting lines and on the control line due to the high voltage applied to write or erase data. This charge is discharged through the memory cells when the power is turned on. Erroneous erasure, erroneous writing, and erroneous reading are prevented by including a reset circuit for producing a reset signal when the power is turned on. A bias circuit is connected to the reset circuit for producing a predetermined voltage during the period of the reset signal. A driver circuit receptive of the reset signal selects and drives all word lines with the predetermined voltage during the period of the reset signal, and discharging circuits are provided for electrically discharging all control lines and all bit lines during the period of the reset signal. When the device is turned on, the reset signal is generated, thereby discharging the bit lines and control lines.

14 Claims, 3 Drawing Sheets

ELECTRICALLY ERASABLE NONVOLATILE MEMORY HAVING DISCHARGING CIRCUITS

BACKGROUND OF THE INVENTION

The present invention relates to an electrically erasable nonvolatile memory, or an EEPROM, having memory cells including selecting gate MOS transistors, control gate MOS transistors, word lines, control lines, and bit lines.

Referring to FIG. 2, a conventional EEPROM has memory cells 1 in which selected word line 101 and control line 111 are set high (20 V) during erasure. At the same time, a control gate 131 selected by these lines is set high. During writing, selected word line 101 and bit line 121 are set high. At the same time, the drain 132 of a control gate MOS transistor 12 selected by them is set high. When the erasure or the writing ends, the supply of the high voltage is stopped when the erasure ends, the source of the high voltage is kept at ground level (0 V) for a given time (several microseconds) while maintaining the control line 111 and the control gate 131 in selected state. When the writing ends, the source of the high voltage is kept at ground level for a given time while maintaining the bit line 121 and the drain 132 of the control gate MOS transistor 12 in selected state. In this way, when the erasure ends, the selected control line 111 and control gate 131 are electrically discharged. When the writing ends, the selected bit line 121 and the drain 132 of the control gate MOS transistor 12 are electrically discharged.

In the conventional EEPROM, if the power is turned off during erasure or writing, the word lines selected immediately before the power is turned off drop to ground level. The control lines or bit lines selected immediately before the power is turned off are released, i.e., have high impedance. Therefore, electric charge remains either on the control lines and the control gates or on the bit lines and the drains of the control gate MOS transistors due to the high voltage. As a result, erroneous erasure, erroneous writing, and erroneous reading can take place.

Accordingly, the present invention is intended to solve this problem with the prior art techniques. It is an object of the present invention to provide an EEPROM which electrically discharges electric charge when the power is turned on, the charge being left due to high voltage remaining after the power is turned off during erasure or writing, whereby preventing erroneous erasure, erroneous writing, and erroneous reading.

SUMMARY OF THE INVENTION

To solve the above problem, the electrically erasable nonvolatile memory device of present invention is so configured that it comprises: a reset circuit for producing a reset signal when power is turned on; a bias circuit for producing a predetermined voltage during the period of application of said reset signal; a driver for selecting and driving all word lines with the predetermined voltage during the period of application of the reset signal; and a plurality of discharging circuits for electrically discharging all control lines and all bit lines during the period of application of reset signal. When the power is turned off during erasure or writing, electric charge is left at a high voltage. This charge is discharged through the discharge circuits when the power is turned on. Thus, erroneous erasure, erroneous writing, and erroneous reading are prevented.

In the EEPROM constructed as described above, the driver selects and drives all word lines with a predetermined voltage obtained from the bias circuit during the period of application of the reset signal produced by the reset circuit when the power is turned on. The discharging circuits operate to electrically discharge the respective control gates and the bit lines. In this way, erroneous erasure, erroneous writing, and erroneous reading are prevented.

DETAILED DESCRIPTION OF THE PREFERRED EMBODIMENTS

Figure 1:
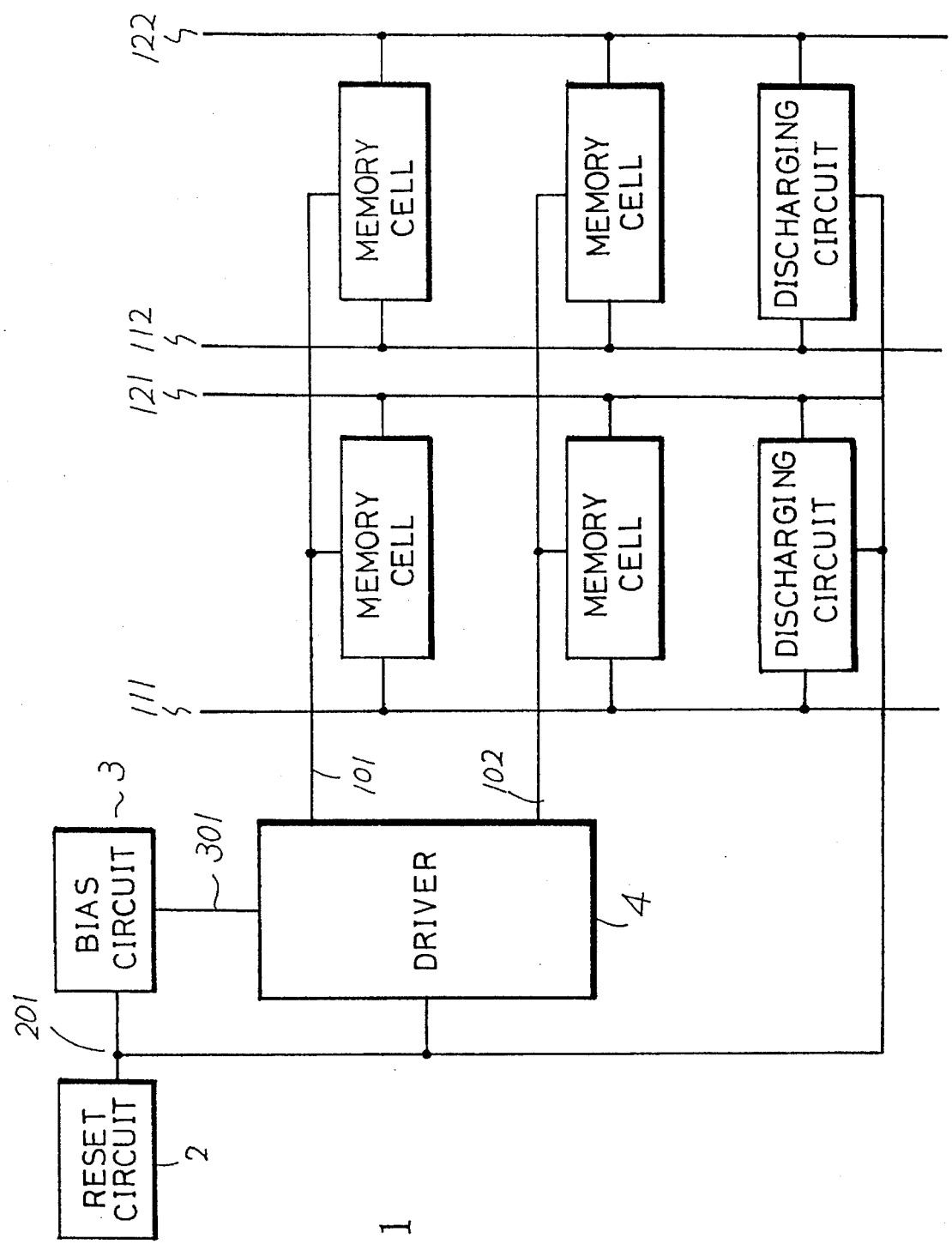
FIG. 1 is a block diagram of an EEPROM according to the present invention.

An embodiment of the present invention is described hereinafter by referring to the drawings. FIG. 1 is an embodiment of the present invention, and is a block diagram of an EEPROM having four memory cells 1. In this example, the EEPROM comprises a reset circuit 2, a bias circuit 3, a driver 4, and two discharging circuits 5, in addition to the memory cells 1.

Figure 2:
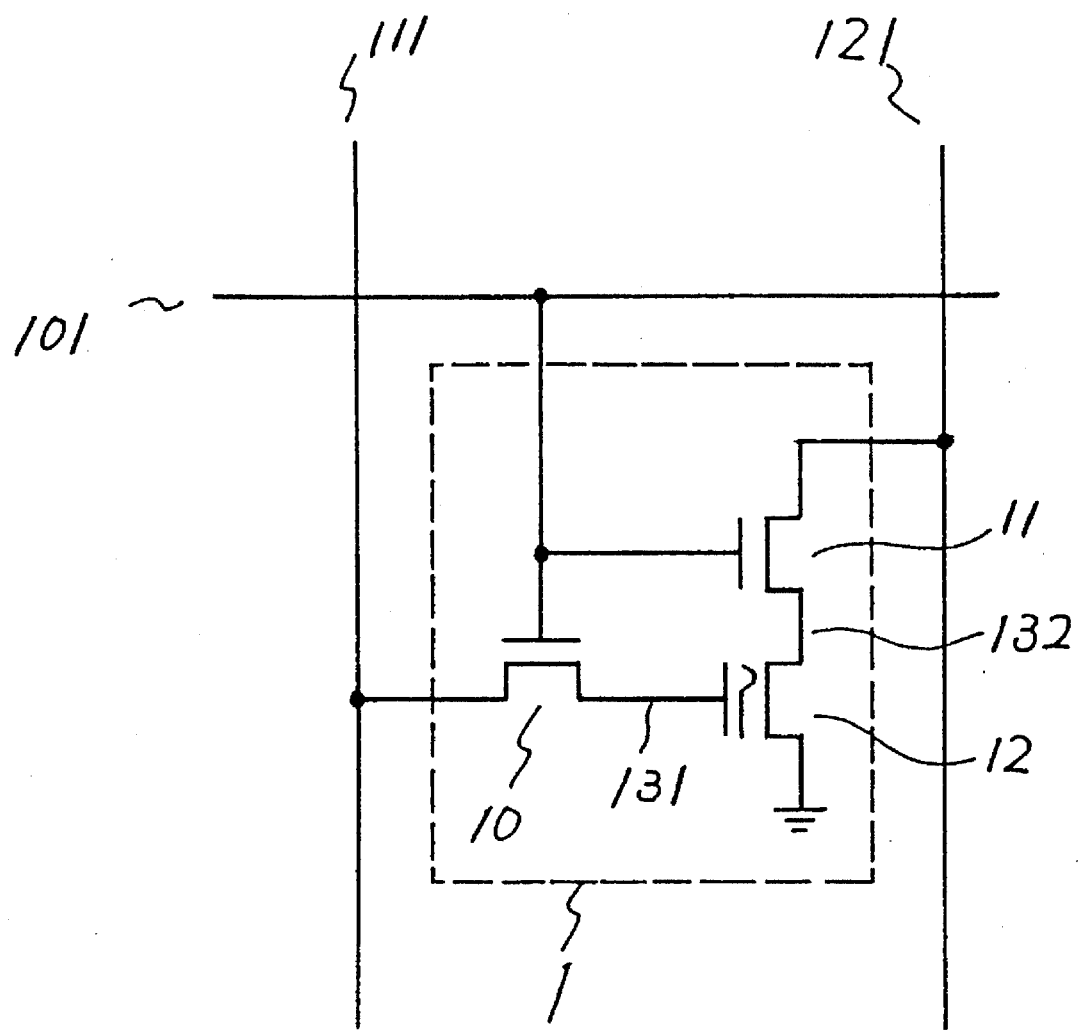
FIG. 2 is a circuit diagram of a memory cell and associated inputs of the prior art EEPROM.

FIG. 2 is a circuit diagram showing the circuit structure of each of four memory cells 1, and is the same as the memory cell of the prior art EEPROM. A selecting gate MOS transistor 10 is connected to a control line 111. A selecting gate MOS transistor 11 is connected to a bit line 121. The EEPROM further includes a control gate MOS transistor 12.

Figure 3:
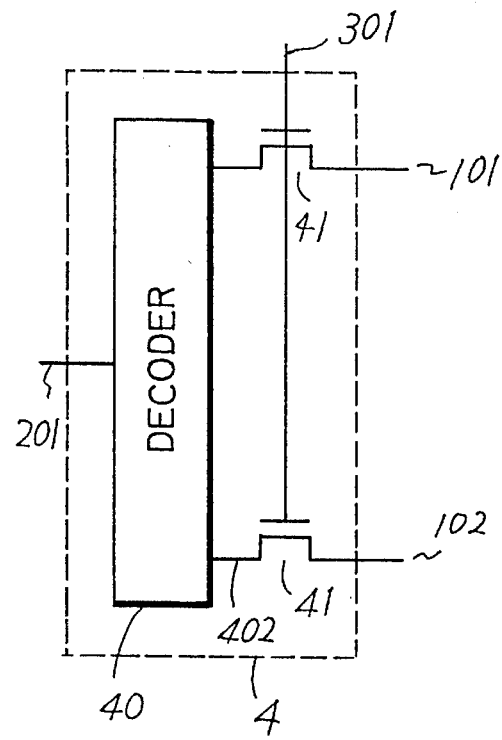
FIG. 3 is a circuit diagram of a driver.

FIG. 3 is a circuit diagram showing the circuit structure of the driver 4. In the present example, the driver is constructed of a decoder 40 and two MOS transistors 41.

Figure 4:
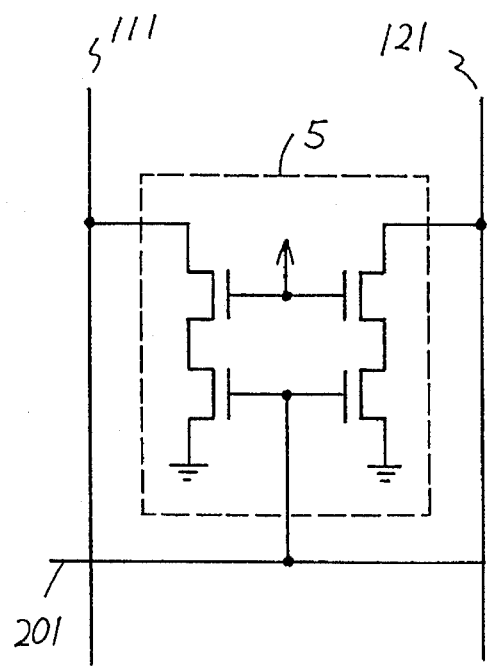
FIG. 4 is a circuit diagram of a discharging circuit.

FIG. 4 is a circuit diagram showing the circuit structure of each of discharging circuits 5 In the present example, two MOS transistors are connected in series between the control line 111 and ground. Two MOS transistors are connected in series between the bit line 121 and ground. In total, each discharging circuit is made up of four MOS transistors.

When the power is turned on, the reset circuit 2 outputs a reset signal 201 for a given time (several microseconds). When the reset signal 201 is applied to the bias circuit 3, the bias circuit 3 outputs a given voltage (2 V) to 301. When the reset signal 201 is applied to the driver 4, the decoder 40 acts to select all word lines inside the driver 4. In this way, a power voltage which is logically high is produced to 401 and 402 and supplied to the sources of the two MOS transistors 41. Since a predetermined voltage delivered from the bias circuit 3 is supplied to the gates 301 of the two MOS transistors 41, a voltage equal to the predetermined voltage supplied from the bias circuit 3 is delivered to the word lines 101 and 102 which are connected to the respective drains of the two MOS transistors 41, respectively. That is, all the word lines are selected and driven with the predetermined voltage. As a result, the selecting gate MOS transistor 10 for the four memory cells 1 is turned on. Consequently, the control line 111 and the control gate 131 conduct.

Similarly, the selecting gate MOS transistor 11 is turned on and so the bit line 121 and the drain 132 of the control gate MOS transistor 12 conduct. When the reset signal 201 is applied to the discharging circuits 5, they start their discharging operation. Then, the control lines 111, 112 and the bit lines 121, 122 are brought to ground level, so that they are electrically discharged. That is, all the control lines, all the control gate lines, all the bit lines, and the drains of all the control MOS transistors are electrically discharged.

The discharging operation is made to persist during the period of the reset signal, or several microseconds. At this time, all the word lines are selected. Therefore, the memory cells are short-circuited to each other via the control lines and the bit lines. All the word lines are selected and driven with a certain voltage, or 2 V, from the bias circuit, rather than with a power voltage that is logically high, the certain voltage being lower than the programmable lowest voltage. Consequently, erroneous erasure and erroneous writing which would otherwise be caused by short circuit is prevented.

As described thus far, the present invention comprises: a reset circuit for producing a reset signal when power is turned on; a bias circuit for producing a certain voltage during period of said reset signal; a driver for selecting and driving all word lines with said certain voltage during the period of said reset signal; and discharging circuits for electrically discharging all control lines and all bit lines during the period of said reset signal. When the power is turned off during erasure or writing, electric charge is left due to high voltage. This charge is discharged when the power is turned on. Thus, erroneous erasure, erroneous writing, and erroneous reading are prevented.

What is claimed is:

1. An electrically erasable nonvolatile memory comprising: a plurality of nonvolatile memory cells; a plurality of word selecting lines electrically connected to respective nonvolatile memory cells; a plurality of control lines electrically connected to respective nonvolatile memory cells; a plurality of bit selecting lines electrically connected to respective nonvolatile memory cells; driver means electrically connected to respective word selecting lines for driving the nonvolatile memory cells with a predetermined voltage through the word selecting lines; bias means electrically connected to the driver means for providing the predetermined voltage to the driver means; discharging means electrically connected to the plurality of control lines and the plurality of bit selecting lines for electrically discharging the control lines and bit selecting lines; and a reset means electrically connected to the bias means, the driver means and the discharging means for providing a reset signal to each of the bias means, the driver means and the discharging means, so that each of the plurality of control lines and the plurality of bit selecting lines word are electrically discharged during the period of the reset signal.

2. An electrically erasable nonvolatile memory according to claim 1; wherein respective nonvolatile memory cells comprise a first MOS device electrically connected to a respective control line and a respective word selecting line, a second MOS device electrically connected to a respective bit selecting line and the respective word selecting line, and a third MOS device electrically connected to the first and second MOS devices so as to be selected in accordance with inputs at the respective word selecting line, the respective bit selecting line and the respective control line.

3. An electrically erasable nonvolatile memory according to claim 2; wherein the first and second MOS devices comprise a selecting gate transistor, and the third MOS device comprises a control gate transistor.

4. An electrically erasable nonvolatile memory according to claim 2; wherein the first MOS device comprises a word selecting transistor, the second MOS device comprises a bit selecting transistor and the third MOS device comprises a control gate transistor.

5. An electrically erasable nonvolatile memory according to claim 4; further comprising means receptive of a high voltage sufficient to erase the contents of the control gate transistor.

6. An electrically erasable nonvolatile memory according to claim 1; wherein the driver means includes means receptive of the reset signal for providing a word selecting output signal to each of the plurality of word selecting lines in accordance with the reset signal.

7. An electrically erasable nonvolatile memory according to claim 6; wherein the level of the word selecting output signal is lower than the lowest level of a word selecting signal applied for writing to respective memory cells.

8. An electrically erasable nonvolatile memory according to claim 7; wherein the means for providing the word selecting signal comprises a decoder means receptive of the reset signal for providing an active high word selecting signal to each of the plurality of word selecting lines in response to the reset signal.

9. An electrically erasable nonvolatile memory according to claim 1; wherein the discharging means includes means for providing a ground path for discharging respective control lines and respective bit selecting lines.

10. An electrically erasable nonvolatile memory according to claim 1; wherein the level of the predetermined voltage is lower than the lowest level voltage capable of writing data to respective memory cells.

11. An electrically erasable nonvolatile memory according to claim 1; wherein the reset means includes means responsive to a power on signal to produce the reset signal in response thereto, so as to reset the respective nonvolatile memory cells upon power up of the memory.

12. A memory device comprising: a memory cell; a selecting line electrically connected to the memory cell; a control line electrically connected to the memory cell; driving means for driving the memory cell; reset means for producing a reset signal; and discharge means electrically connected to the reset means and the memory cell and receptive of the reset signal for electrically discharging the selecting line and the control line in response to the reset signal.

13. A memory device according to claim 12; wherein the driving means includes means for producing a selecting output signal for selecting the memory cell in response to the reset signal.

14. A memory device according to claim 13; wherein the level of the selecting output signal produced by the driving means is lower than the level of a selecting signal applied to the memory cell during writing of data to the memory device.

* * * * *